United States Patent [19]

Czerwien et al.

[11] 4,303,881

[45] Dec. 1, 1981

[54] MULTI-FUNCTION A.C. POWER METER

[76] Inventors: Arthur S. A. Czerwien; Heinz E. Feyer, both of 3367 Freidinger Dr., Pensacola, Fla. 32506

[21] Appl. No.: 19,729

[22] Filed: Mar. 12, 1979

[51] Int. Cl.³ ..................... G01R 21/06; G01R 25/00
[52] U.S. Cl. ................................ 324/142; 324/83 A; 324/115
[58] Field of Search ..................... 324/142, 115, 83 A, 324/83 R, 89

[56] References Cited

U.S. PATENT DOCUMENTS 2,577,992  12/1951  Armstrong.
3,084,863   4/1963  Du Vall.

OTHER PUBLICATIONS

Florman, E. F.; "An Electronic Phasemeter"; *Proc. of the I.R.E.*; Feb. 1949; pp. 207-210.

*Primary Examiner*—Ernest F. Karlsen
*Attorney, Agent, or Firm*—Wigman & Cohen

[57] ABSTRACT

A multi-function alternating current meter having a voltage probe and clamp type current probe for sampling voltage and current of a alternating current line without physically breaking into the line. Components include the two input probes which are connected to a squaring circuit and compensated low pass active filters which are arranged for feeding the respective output signals into an analog summing amplifier. Subsequently the signals are fed into a calibrated output indicator. A scaled multiplier and phase lead/lag detector are included in the circuit. Switches are capable of rerouting the input signals through various components, and the various outputs are individually applied to the calibrated output indicator to indicate the A.C. line's power factor, phase angle, true power, apparent power, voltage, current, or lead/lag status, as selected.

8 Claims, 5 Drawing Figures

| INPUT CONDITION | MONOSTABLE 42 | | | | MONOSTABLE 43 | | | | MONO 51 | NAND GATE 50 |
|---|---|---|---|---|---|---|---|---|---|---|
| | Q | Q̄ | ENABLE | RESET | Q | Q̄ | ENABLE | RESET | Q | OUTPUT |
| NO INPUT | 0 | 1 | 0 | 1 | 0 | 1 | 0 | 1 | 0 | 1 |
| VOLTAGE LEAD | 1 | 0 | 0 | 1 | 0 | 1 | 0 | 0 | 0 | 1 |
| VOLTAGE LAG | 0 | 1 | 0 | 0 | 1 | 0 | 0 | 1 | 0 | 1 |
| IN PHASE | 0 | 1 | 1 | 1 | 0 | 1 | 1 | 1 | 1 | ↓ |

MULTI-FUNCTION A.C. POWER METER

BACKGROUND OF INVENTION

This invention relates to an electrical meter having the capacity to measure various parameters of an alternating current line, including power factor, phase angle, true power, apparent power, voltage, current, and lead/lag status. Previous methods of determining the power factor of a circuit required several independent measurements with bulky equipment, required either breaking the circuit or having the equipment permanently installed within the line, and required external calculations based on the independent measurements. This invention is light weight and is well suited for field use. It overcomes the problems associated with previous meters by having the capacity for being utilized without breaking the circuit or being permanently installed and by requiring no subsequent external calculations.

SUMMARY OF INVENTION

The improved meter of this type is an automatic solid state instrument capable of both field use and permanent installation into a line. It has a voltage probe and clamp type current probe for sampling voltage and current of the alternating current without physically breaking into the line. Several rotary switches are provided for selection of the parameter to be measured. Power factor measurements are directly made by applying the sample voltage and the sample current respectively to squaring circuits and the outputs of the squaring circuits to compensated low pass active filters. The two resulting outputs are applied to an analog summing amplifier which produce a single signal for application into the Calibrated Output Indicator. A scale is visible on the Calibrated Output Indicator for direct reading of the power factor. The phase angle function is accomplished with the various switches positioned to bypass the two compensated low pass active filters.

True power measurements are made with the various switches positioned to bypass the two compensated low pass active filters and to interpose a scale multiplier between the analog summing amplifier and the Calibrated Output Indicator. Apparent power measurements are made with the various switches positioned as in making true power measurements except that the squaring circuits are also bypassed and the voltage and current samples are applied directly into the scale multiplier.

The meter serves as a voltmeter when the switches are positioned to substitute a fixed reference voltage for the current sample. The meter serves as an A.C. current meter when the switches are positioned to substitute a fixed reference voltage for the voltage sample. Lead/lag measurements are made by applying the square waves directly into the lead/lag detector.

This invention measures the parameters described above by use of circuit configurations which electronically represent the mathematical equations that define them.

This multi-function A.C. power meter can perform all or any one of its functions at the standard industrial and commercial line frequency of 60 Hz (50Hz European) or at the standard avionics frequency of 400 Hz by simply selecting the line frequency of interest by means of a frequency select switch. It can also be used where unusual or rare A.C. line frequencies exist by means of internal adjustments to the compensated low pass active filters. Such unusual frequencies include the older avionics frequency of 800 Hz.

This meter can be built to meet or exceed full military standards for instruments and devices of its type.

BRIEF DESCRIPTION OF THE DRAWINGS

Further details are explained below with the help of the attached drawings in which.

DETAILED DESCRIPTION OF THE PREFERRED EMBODIMENT

Figure 1:
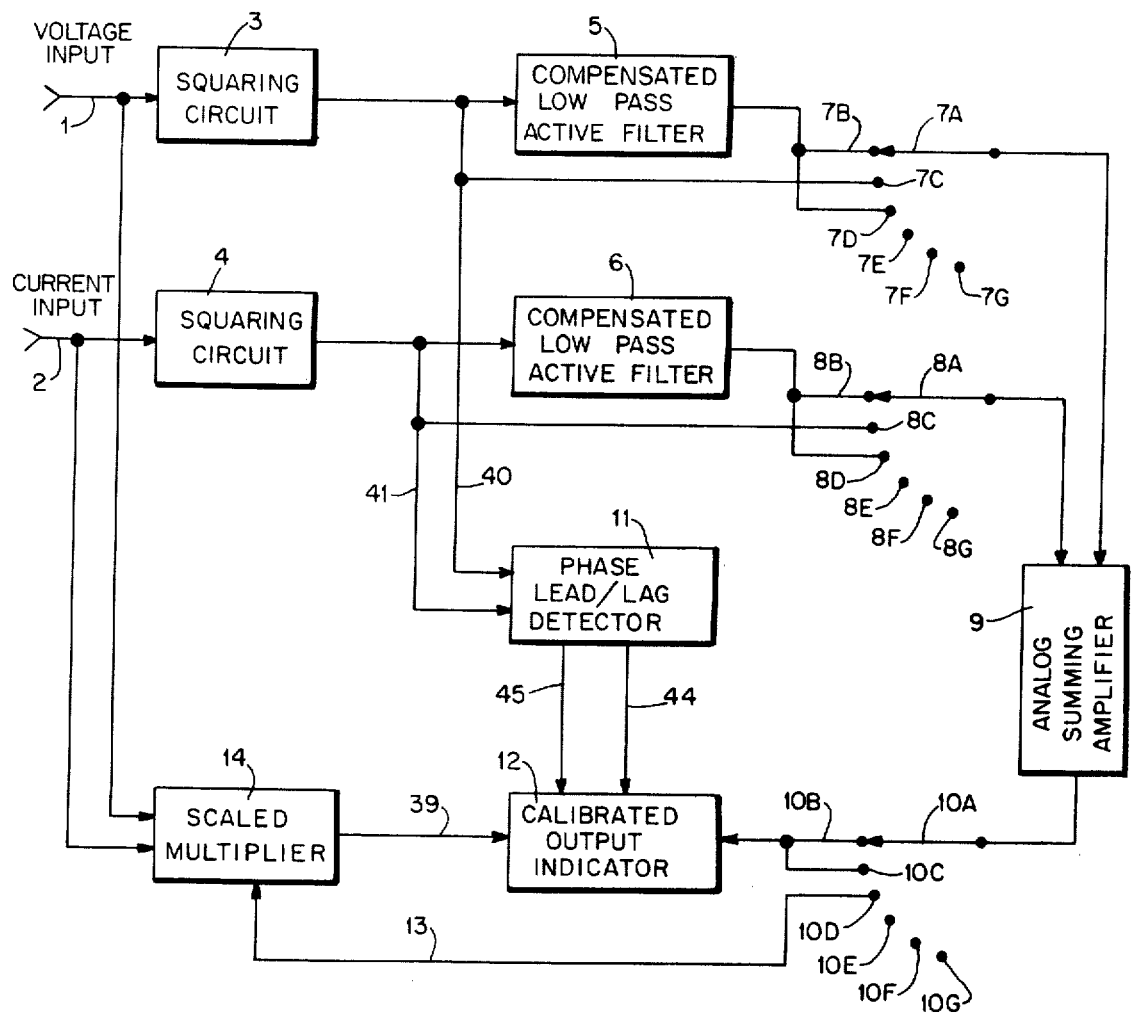
FIG. 1 is a functional block diagram of the entire invention.
Figure 2:
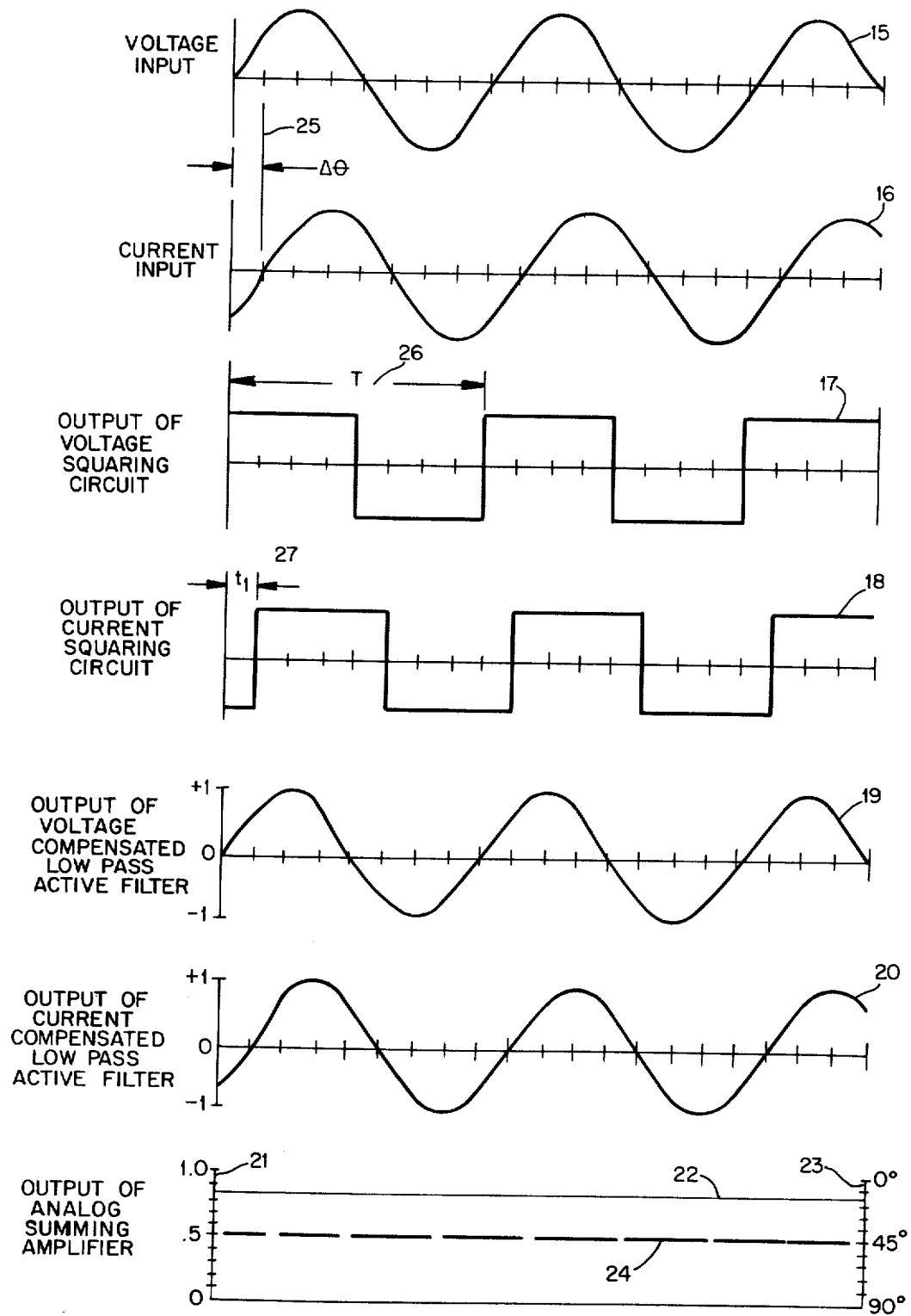
FIG. 2 shows the various wave shapes associated with the invention.

This invention relates to a solid state measuring device for use in the electrical and electronic fields to determine and measure various parameters of A.C. power lines. These parametrs include: power factor, phase angle, true power, apparent power, A.C. voltage, A.C. current, and phase lead/lag. The invention is so designed that it can be used to measure the above parameters directly without physically breaking into the power lines. Because of the exclusive use of modern state of the art type integrated circuits, the invention is physically small in size and weight. This feature renders it excellent for field use, as well as permanent installations. The invention is simple and straight forward to operate. A person with the most basic knowledge of electricity is capable of using it.

The invention accomplishes the measurements of the above stated parameters by taking a sample of the A.C. line voltage by means of a voltage probe and a sample of the line current by means of a clamp type current probe. The output of the current probe is a voltage proportional to the current. The outputs of the voltage and current probes are applied to appropriate circuits in the invention to generate the desired output parameters. The circuits used to generate the desired parameters are so configured as to electronically represent the mathematical equations used to define and calculate the desired parameters.

The invention consists of the following components: the voltage squaring circuit 3; the current squaring circuit 4; the voltage compensated low pass active filter 5; the current compensated low pass active filter 6: the analog summing amplifier 9: the scaled multiplier 14: the phase lead/lag detector 11: and the Calibrated Output Indicator 12.

Multi-gang rotary switch 7A, 8A, 10A, 34A, 36A is used as a function select switch. Since this invention is a multi-function device, each individual function will be described separately. The order of descriptions will be as follows:

Power factor measurement.
Phase angle measurement
True power measurement
Apparent Power measurement
A.C. voltage measurement
A.C. current measurement
Phase lead/lag indication To perform any of the above measurements the voltage probe is connected across the A.C. line to be measured and the clamp type current probe is connected around one of the A.C. lines. No interruption of power or disconnection of the A.C. line under test is necessary to perform any of the above mentioned measurements.

The voltage input at 1 will be defined as $E_{mv}\cos(wt)$ (Equation 1), and the current input at 2 will be defined as $E_{mi}\cos(wt+p)$ (Equation 2). The wave form for $E_{mv}\cos(wt)$ is 15 and the wave form for $E_{mi}\cos(wt+p)$ is 16. With the multi-gang rotary switch 7A, 8A, 10A, 34A, 35A, 36A placed in the 7B, 8B, 10B, 34B, 35B, 36B position respectively, the multi-function AC power meter is configured as a power factor meter.

The input voltage 1 and input current 2, are connected to squaring circuits 3 and 4 respectively. The squaring circuits transform the incoming signals from sinewaves to squarewaves. Waveforms 17 and 18 illustrate the outputs of the squaring circuits 3 and 4. The purpose of the squaring circuits is to nominalize the amplitudes of the incoming voltage and current waveforms 15 and 16 and present a constant amplitude signal to the appropriate compensated low pass active filters 5 and 6. Note that even though the input voltage and input current waves 15 and 16 are transformed into square waves 18 and 19 respectively, the zero-crossing points are not affected. This is extremely important in maintaining the original phase relationship of the input signals. The compensated low pass active filters 5 and 6 have a cutoff frequency equal to the A.C. line frequency and thus remove all the harmonic components of the applied squarewaves and present at their respective outputs 7B and 8B constant equal amplitude reconstituted sinewaves 18, 19, of the applied input voltage and input current wave forms 15 and 16 with the original phase angle difference 25. The outputs of the compensated low pass active filters are applied to the analog summing amplifier. For power factor measurements the analog summing amplifier 9 is configured as a phase detector and calibrated output amplifier. The output of the phase detector will be $e_o = E_v E_i \cos(wt)\cos(wt+p)$ (Equation 3) where $E_v \cos(wt)$ is the voltage wave 18 and $E_i \cos(wt+p)$ 19 is the current wave. Since $E_v = E_i = E$ because of the signal processing described above Equation 3 reduces to $e_o = E^2 \cos(wt)\cos(wt+p)$ (Equation 4). By trigometric identity Equation 4 becomes $e_o = E^2 [\cos(p) + \cos(2wt+p)]$ (Equation 5).

The input of the calibrated output amplifier is filtered to remove the 2nd harmonic component of Equation 5 and the resulting output applied to the calibrated output indicator 12 will be $e_{D.C.} = E^2 \cos(p)$ (Equation 6) wherein the difference angle $\alpha\theta 25$ is P. This output 21, 22 is directly proportional to the cosine of the difference angle between the voltage intput 15 and the current input 16 and is the power factor.

With the multi-gang rotary switch 7A, 8A, 10A, 34A, 35A, 36A, placed in the 7C, 8C, 10C, 34C, 35C, 36C positions respectively, the multi-function A.C. power meter is configured as a phase angle meter. In this configuration the compensated low pass active filters 5, 6, are bypassed, and the analog summing amplifier is connected as an summing amplifier. Refer to FIG. 1.

$$e_v = \frac{1}{T_0} \int_0^{.5T} E_{max} dt \quad \text{(Equation 7)}$$

and

-continued $$e_i = \frac{1}{T} \int_{T_1}^{.5T} E_{max} dt \quad \text{where } T_1 \geq 0 \leq .5T. \quad \text{(Equation 8)}$$

T26 is defined as the period of time the leading edge of the voltage waveform 17 at the output of the voltage squaring circuit 3, to the end of one complete cycle. Equation 7 and Equation 8 by integration reduce to $e_v = 0.5T$ (Equation 9) and $e_i = (0.5T - t_1)T$ (Equation 10).

The inputs, Equation 9 and Equation 10, to the analog summing amplifier 9 are algebraically added and the output of the analog summing amplifier is $e_o = e_v e_i = 0.5T^2(0.5T - t_1)$ (Equation 11). In this mode of operation the output of the analog summing amplifier 23, 24 will vary linearly from 0° to 90° as T, 27 varies from 0 to 0.5T. The output of the analog summing amplifier 9 is applied to the calibrated output indicator.

Figure 3:
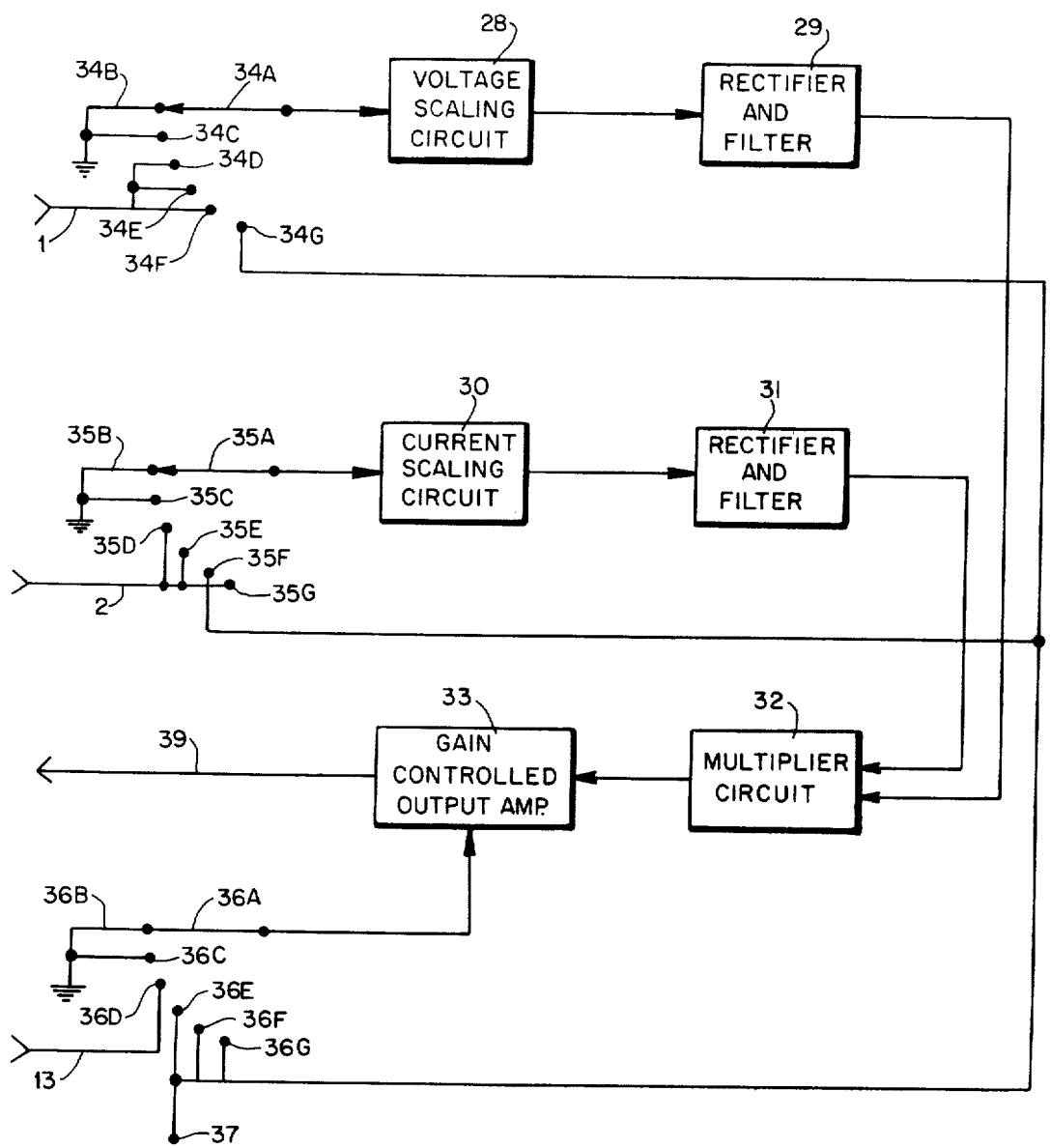
FIG. 3 is a functional block diagram of the scale multiplier.
Figures 4, 5:
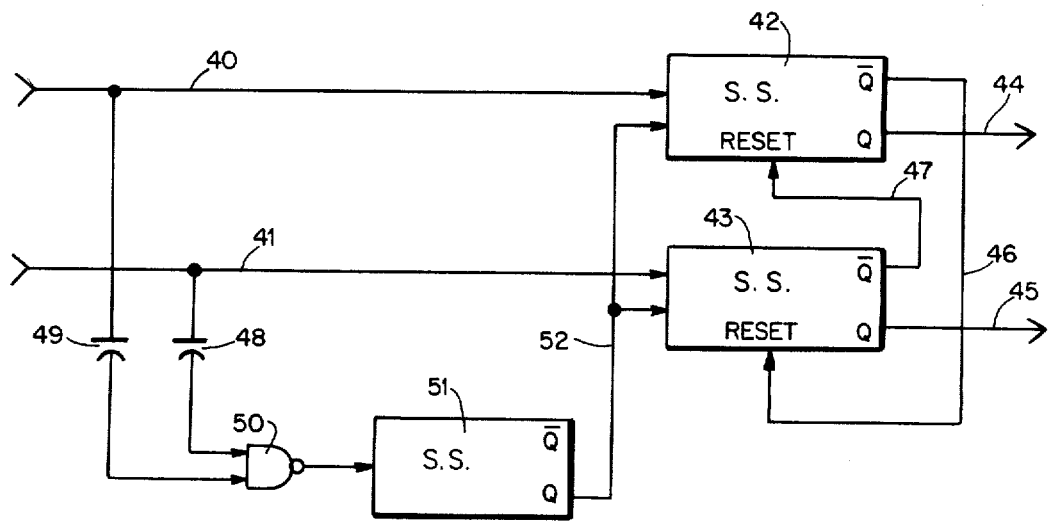
FIG. 4 is a simplified block drawing of the phase lead/lag detector.
FIG. 5 is a truth table for the phase lead/lag detector.

With the multi-gang rotary switch 7A, 8A, 10A, 34A, 35A, 36A, placed in the 7D, 8D, 10D, 34D, 35D, 36D positions respectively, the multi-function A.C. power meter is configured as an A.C. watt meter and will measure true power. In this mode of operation, the analog summing amplifier 9 is configured as an phase detector and calibrated output amplifier mode, the same as for power factor measurements. The analog summing amplifier 9 is disconnected from the calibrated output indicator 12 and connected 13 to the scaled multiplier 14. The scaled multiplier 14 is an analog multiplier, which multiplies its inputs and gives a D.C. level output proportional to the product of the inputs. Refer to FIG. 3. The inputs to the scaled multiplier 14 come from the voltage input 1 and the current input 2. These inputs 1, 2, are individually scaled by scaling circuits 28 30, depending on their respective amplitudes and then rectified and filtered 29, 31. The resulting signals applied to the multiplier section 32 of the scaled multiplier 14 are $K_1 E_v$ and $K_2 E_i$ where $K_1$ and $K_2$ are the respective scaling factors. The output of the multipler section 32 will be $E_{out} = K_1 K_2 E_v E_i$ (Equation 12). This signal is applied to the gain controlled output amplifier 33 of the scaled multiplier. The gain of this amplifier is linearly proportional to an applied voltage at its gain control input 13. The output of the analog summing amplifier is applied to this point. The final output of the scaling multiplier will then be $E_{out} = K_1 K_2 E_v E_i \cos(p)$ (Equation 13).

Equation 13 is by definition an expression for true power. The output 39 of the scaled multiplier 14 is applied to the calibrated output indicator 12.

With the multi-gang rotary switch 7A, 8A, 10A, 34A, 35A, 36A, placed in the 7E, 8E, 10E, 34E, 35E, 36E positions respectively, the multi-function A.C. power meter is configured as an apparent power meter. In this configuration both the inputs 7A, 8A, and the outputs 10A of the analog summing amplifier 9 are disconnected completely from the rest of the circuit. The scaled multiplier 14, functions identically as it does for measuring true power except that the gain control line 13 is set at unity gain. The output of the scaled multiplier will then be $E_{out} = K_1 K_2 E_v E_i$ (Equation 14). This equation is by definition the expression for apparent power, voltage times current (VA). The output 39 of the scaled multiplier 14 is applied to the calibrated output indicator.

With the multi-gang rotary switch 7A, 8A, 10A, 34A, 35A, 36A, placed in the 7F, 8F, 10F, 34F, 35F, 36F position, the multi-function A.C. power meter is configured as an A.C. voltmeter. In this configuration the current input 2 to its respective scaling circuit 30 in the scaled multiplier 14 is disconnected an a fixed reference voltage 37 is applied to the scaling circuit input 35A. The gain control input 38 is set for unity gain. The output of the scaled multiplier will then be $E_{out}=K_1$-$K_3E_v$ where $K_3$ is a constant (Equation 15). This output is directly proportional to the input voltage and is applied to the calibrated output indicator.

With the multi-gang rotary switch 7A, 8A, 10A, 34A, 35A, 36A, placed in the 7G, 8G, 10G, 34G, 35G, 36G position, the multi-function A.C. power meter is configured as an A.C. current meter. In this configuration the voltage input 1 is disconnected from its respective scaling circuit 28 in the scaled multiplier 14 and fixed reference voltage 37 is applied to the scaling circuit input 36A. The gain control input 28 is set for unity gain. The output of the scaled multiplier will then be $E_{out}=K_2$-$K_3E_i$ (Equation 16). This output is directly proportional to the input current and is applied to the calibrated output indicator.

The phase lead/lag detector 11, which functions in all modes of operation consists of 2 resettable mono-stables inter-connected in such a way as to have only one of the mono-stables triggerable depending on the relationship of the phase between the input voltage and input current. FIG. No. 4 is a simplified block diagram of the phase lead/lag detector 11. FIG. No. 5 is a simplified truth table for the phase lead/lag detector. Mono-stable 51 is used as an enable/disable command and is only triggerable in an inphase condition. The inputs 40, 41 to the phase lead/lag detector 11, come from the voltage squaring circuit 3 and the current squaring circuit 4 respectively. The mono-stables 42 and 43 are configured in such a way that they will trigger on the leading edge of an input signal. In a phase lead condition mono-stable 42 will trigger and its Q output 44 will go to an "I" state. This output which is coupled to the calibrated output indicator signifying a phase lead condition. The Q output 46 will go to a "O" state and is coupled to the reset input of mono-stable 43 inhibiting it. In a phase lag condition mono-stable 43 will trigger and its Q output 45 will go to an "I" state. This output which is coupled to the calibrated output indicator signifying a phase lag condition. The Q output 47 will go to a "O" state and is coupled to the reset input of mono-stable 42 inhibiting it. In out-of-phase conditions mono-stable 51 has it s Q output 52 in the "O" state; this output is coupled to both mono-stables 42 and 43 an puts them in the enable state. In an in-phase condition, the leading edge outputs of squaring circuits 3 and 4 arrives at capacitors 48 and 49 at the same time. Capacitors 48 and 49 differentiate the outputs of squaring circuits 3 and 4 and apply the differentiated pulses to nand gate 50. Since in an in-phase condition both pulses arrive at the nand gate simultaneously, the output of the nand gate will momentarily go from an "I" state to an "O" state. This will trigger mono-stable 51 and it s Q output will go to an "I" state disabling mono-stables 42 and 43. The Q outputs 44, 45 of mono-stables 42 and 43 will remain in an "O" state and the calibrated output indicator will indicate an in-phase condition.

The calibrated output indicator 12 consists of an output indicator which depending on the function selected, will display the value of the parameter under test. The output indicator can be either a calibrated analog meter movement or as a calibrated digital readout. Phase lead/lag is indicated by "+" or "−" readouts.

From the foregoing technical description of the multifunction A.C. power meter it can be seen that this invention is a novel and unique device capable of directly measuring all parameters associated with A.C. power and A.C. power lines. These include power factor, phase angle, true power, apparent power, A.C. voltage, A.C. current and phase lead/lag. The invention requires no external calibration and is simple to use.

While the foregoing illustrates a particular embodiment of the invention, it will be understood that many modifications may be made without departing from the spirit thereof.

What is claimed is:

1. An electrical meter for measuring various parameters of an alternating current line, comprising:
   (a) a first input terminal;
   (b) a voltage probe for sampling a first voltage of an alternating current line and for applying said first voltage to said first input terminal;
   (c) a second input terminal;
   (d) a current probe for sampling a current of an alternating current line, for converting said current into a second voltage, and for applying said second voltage to said second input terminal;
   (e) a first means connected to said first input terminal for converting said first voltage into a first square wave;
   (f) a second means connected to said second input terminal for converting said second voltage into a second square wave;
   (g) a first compensated low pass active filter connected to said first voltage converting means for producing a first filtered square wave;
   (h) a second compensated low pass active filter connected to said second voltage converting means for producing a second filtered square wave;
   (i) an analog summing amplifier connected to receive said first and second filtered square waves and produce an output signal therefrom; and
   (j) a calibrated output indicator connected to receive said output signal;
   wherein said calibrated output indicator indicates power factor.

2. An electrical meter as recited in claim 1, further comprising:
   (a) a first switch having the capacity for being positioned to apply said first square wave directly into said analog summing amplifier; and
   (b) a second switch having the capacity for being positioned to apply said second square wave directly into said analog summing amplifier; and 3. The electrical meter as recited in claim 2, wherein said calibrated output indicator indicates at least one of power and phase angle.

4. An electrical meter for measuring various parameters of an alternating current line, comprising:
   (a) a first input terminal;
   (b) a voltage probe for sampling a first voltage of an alternating current line and for applying said voltage to said first input terminal;
   (c) a second input terminal;
   (d) a current probe for sampling a current of an alternting current line, for converting said current into a second voltage, and for applying said second voltage to said second input terminal;
   (e) a first means connected to said first input terminal for converting said first voltage into a first square wave;

(f) a second means connected to said second input terminal for converting said second voltage into a second square wave;

(g) a first compensated low pass active filter connected to said first voltage converting means for producing a first filtered square wave;

(h) a second compensated low pass active filter connected to said second voltage converting means for producing a second filtered square wave;

(i) an analog summing amplifier;

(j) means for applying said first and second filtered square waves to said analog summing amplifier to produce an output signal;

(k) a calibarated output indicator;

(l) means for applying said output signal to said calibrated output indicator;

(m) a scale on said calibrated output indicator for indicating power factor;

(n) a first switch having the capacity for being positioned to apply said first square wave directly into said analog summing amplifier;

(o) a second switch having the capacity for being positioned to apply said second square wave directly into said analog summing amplifier;

(p) a scale on said calibrated output indicator for indicating phase angle;

(q) a scale multiplier having a first internal input terminal, means for applying said first voltage to said first internal input terminal, a second internal input terminal, means for applying said second voltage to said second internal input terminal, a first voltage scaling circuit connected to said first internal input terminal, a first rectifier and filter connected to said first voltage scaling circuit, a second voltage scaling circuit connected to said second internal input terminal, a second rectifier and filter connected to said second voltage scaling circuit, a multiplier circuit, means connected to said multiplier circuit for receiving the signals from the first and second rectifier and filters, a gain controlled output amplifier, means connecting said gain controlled output amplifier to said multiplier circuit, means for receiving input from said analog summing amplifier; and means for sending output signals to said calibrated output indicator;

(r) a third switch having the capacity for being positioned to apply the signal from said analog summing amplifier into said scale multiplier for controlling gain of said gain controlled output amplifier;

(s) means connected to said scale multiplier for applying said output signal to said calibrated output indicator; and (t) a scale on said calibrated output indicator for indicating true power.

5. An electrical meter as recited in claim 4, further comprising:

(a) a first switch having the capacity for being positioned to apply said first square wave directly into said analog summing amplifier wherein said first switch has the further capacity of being positioned to apply said first voltage from said first input terminal directly into said scale multiplier;

(b) a second switch having the capacity for being positioned to apply said second square wave directly into said analog summing amplifier wherein said second switch has the further capacity of being positioned to apply said second voltage from said second input terminal directly into said scale multiplier;

(c) a third switch having the capacity for being positioned to apply the signal from said analog summing amplifier into said scale multiplier wherein said third switch has the further capacity of being positioned to disconnect the analog summing amplifier from the rest of the circuit; and (d) a scale on said calibrated output indicator for indicating apparent power.

6. An electrical meter as recited in claim 5, further comprising:

(a) a fixed reference voltage;

(b) means for applying said fixed reference voltage within said scale multiplier;

(c) a fourth switch located within the scale multiplier having the capacity for being positioned to disconnect the means for applying said second voltage from said second internal input terminal and having the further capacity of being positioned to connect said means for applying said fixed reference voltage to said second voltage scaling circuit; and (d) a scale on said calibrated output indicator for indicating voltage.

7. An electrical meter as recited in claim 6, further comprising:

(a) a fourth switch located within the scale multiplier having the capacity of being positioned to disconnect the means for applying said first voltage from said first internal input terminal and having the further capacity of being positioned to connect said means for applying said fixed reference voltage to said first voltage scaling circuit; and (b) a scale on said calibrated output indicator for indicating current.

8. An electrical meter as recited in claim 4, further comprising:

(a) a phase lead/lag detector;

(b) means for applying said first and second square waves directly into said phase lead/lag detector regardless of the positions of said first, second, and third switches;

(c) means located on said phase lead/lag detector for indicating phase lead/lag.

* * * * *